United States Patent [19]
Errico et al.

[11] Patent Number: 5,543,187
[45] Date of Patent: Aug. 6, 1996

[54] AMORPHOUS METAL - CERAMIC COMPOSITE MATERIAL

[76] Inventors: Joseph P. Errico, 150 Douglas Rd., Far Hills, N.J. 07931; Steven J. Hultquist, 5000-303 Beaverbrook Rd., Raleigh, N.C. 27612

[21] Appl. No.: 320,512

[22] Filed: Oct. 11, 1994

[51] Int. Cl.⁶ .................................................. B28B 21/00
[52] U.S. Cl. .................. 428/34.6; 428/229; 428/251; 428/332; 428/457; 428/902
[58] Field of Search .................................. 428/457, 902; 429/229, 251, 332, 34.6

[56] References Cited

U.S. PATENT DOCUMENTS

4,770,701  9/1988  Henderson et al. ............... 75/232

Primary Examiner—James J. Bell
Attorney, Agent, or Firm—J. P. Errico; Steven J. Hultquist

[57] ABSTRACT

A composite material comprising a multilaminate structure of amorphous metal and ceramic laminae, and a method of making the same. The material may be formed of a high strength, low inhibitor content, amorphous metal, e.g., in a single ribbon form, or in a woven multi-ribbon sheet form having a substantially greater width than the single ribbon form, in which the amorphous metal is coated with a thin layer of high compressive strength, low temperature curing ceramic. Ceramic/amorphous metal composites of the invention are usefully employed in structural composite applications, in which the amorphous metal may be utilized as an electrically conductive structural component. Superconducting composites are also disclosed, which have potential utility in applications such as power transmission lines, generators, superconducting magnets, high speed operating switches, bolometers, high frequency communications components, and motors.

29 Claims, 5 Drawing Sheets

AMORPHOUS METAL - CERAMIC COMPOSITE MATERIAL

BACKGROUND OF THE INVENTION

1. Field of Invention

This invention relates to a novel high-strength composite material, specifically a composite material comprising a wound multilaminate structure of amorphous metal ribbon and ceramic laminae, and to a method for producing same.

2. Background of the Invention

One of the continuing goals of the specialty materials industry is the production of materials with enhanced properties such as corrosion resistance, hardness, and tensile strength. One well known method of achieving this goal has been the creation of new forms of old materials by alloying or by changing the microstructure of the material to one with different properties. Another method is the formation of composite structures which physically integrate one material with another (often the two are dissimilar—such as epoxy resin and carbon fibers) in order to create a new material which has greater strength (or other desirable enhanced property) than any constituent thereof alone.

Under normal solidity conditions metals have an ordered atomic structure (microstructure). This structure comprises a lattice of metal atoms forming a regular repeating geometric atomic array. As a metal solidifies, or if it is subject to a sufficiently high temperature to initiate recrystallization, the atoms are only able to arrange themselves into local regions of ordered structure. The size of these individual regions, or grains, is determined by the speed at which solidification takes place (larger grain sizes requiting more time, entailing slower cooling, to order themselves).

Crack propagation is the primary mechanism by which materials under stress fail. Cracks within ordered lattice regions (grains) are inherent in all crystalline structures in statistically quantifiable concentrations due to ordering faults controlled by thermodynamic principles. Grain boundaries, however, provide the majority of crack initiating stress concentration points due to voids present at boundaries between multiple grains which are not aligned ideally with respect to one another. Grain boundaries also provide nucleation sites for travelling ordering faults within the grains.

Crack propagation through crystalline metals is further enhanced by slip systems and tip stress concentrations which are inherent in the crystal lattices of these metals, both in the grains and between the grains. The simple theoretical atom to atom bond strength of most metals predicts an overall material strength that is on the order of 10 to 1,000 times the strength that is actually measured in crystalline metals.

Amorphous metals are metals which have been formed in such a way so as to have no crystalline structure, i.e., are non-crystalline metals. The formation of amorphous metals is achieved by cooling a metal from a molten state to the solid phase at sufficiently a high rate so that the grain size shrinks to the size of a single atom. Therefore, because a single atom is its own grain, this metal has no long, or even short, range order. No grains or grain boundaries means that the resulting amorphous metal has dramatically fewer voids and crack nucleation sites.

The absence of crystalline regions means that the metal is substantially devoid of slip systems and substantially free of significant mobility of faults to nucleation sites. The inherent strength of the metal is dramatically increased since any residual cracks in the metal have no lattice-type regular paths along which to propagate. In theory, a pure amorphous metal would exhibit remarkably enhanced tensile strength relative to corresponding crystalline metals.

The existence of the amorphous state of a metal is readily empirically verified by X-ray crystallography techniques of a conventional type, as revealing the non-crystalline character of the amorphous metal.

Traditionally, however, amorphous metal compositions have necessarily included crystallization inhibitor components (hereinafter referred to as inhibitors) because even the fastest molten metal cooling rates achievable to date have been slower than the crystallization rates in pure (inhibitor-free) metals. Unfortunately, these inhibitors have a secondary effect of reducing the tensile strength of the resulting metal. In addition, the cooling techniques that have been used to achieve significantly reduced recrystallization rates, concurrently limit the dimensions of the amorphous metal, so that the amorphous metal product article is typically of very small size.

Commercially produced amorphous metals are formed by a process of pouring a molten metal-inhibitor mixture onto a rapidly spinning wheel which is cooled with liquid nitrogen. The amorphous metals produced by this rapid "spin quenching" technique are thus formed in thin ribbons. The thickness of the metal ribbons, along with the structural weakening of the product material resulting from the presence of the inhibitor component(s), has hindered previous attempts to take advantage of the potential structural value of amorphous metals.

Although recent advances have reduced the amounts of inhibitors necessary in the molten metal to suppress crystallization, and by such reduced inhibitor concentration dramatically increased the attainable tensile strengths (reported amorphous metal ribbon tensile strengths for such "low inhibitor" molten metal compositions have been measured in excess of 400,000 psi), to strength levels generally associated with structural applications, the physical constraint of the ribbon or strip form of the amorphous metal product that is imposed by the spin quenching technique has posed a continuing barrier to efforts to use amorphous metals in such structural applications.

Ceramic materials, including ceramics of covalent as well as ionically bonded character, are used extensively throughout industry, in many applications. While ceramics have inherent tensile and compressive strengths far exceeding the strength values of many other materials, ceramics are highly susceptible to defects incorporated during their formation process. These defects lead to strength faults when the ceramic is produced in bulk form, and such strength faults in turn reduce the structural integrity of the product ceramic material.

Fiber-form ceramics, often referred to as ceramic whiskers, have a reduced defect size and concentration, and as a result exhibit strengths ranging up to and beyond 700,000 psi. Fibers, however, have limited structural utility by themselves, and typically are employed as discontinuous reinforcement elements in composite materials, as hereinafter more fully described. Thus the use of ceramics in structural applications, where their intrinsic high strengths would otherwise be highly advantageous, has been limited.

The combination of metals and ceramics, wherein each's strengths used are to compensate for the weaknesses of the other, is well known in the art.

The most widely known form of such combination has been ceramic fiber-reinforced metals which are comprised of a metal matrix, loaded with solid ceramic fibers, produced by introduction of ceramic fibers into the metal while in the molten state, and before solidification thereof. The resulting molten metal/ceramic fibers mixture is subsequently cooled in such a way that the fibers are spread through the matrix in a predetermined distribution (most often such distribution is a constant concentration, random orientation distribution throughout the resulting composite).

The ceramic fibers in such resulting composite retain their inherent high strength and contribute crack resistance which strengthens the matrix metal by preventing cracks from propagating through the metal. The ceramic fibers in the metal matrix composite also constrain the metal from flowing elastically or plastically under applied loads, so that the metal matrix composite material exhibits increased hardness and creep resistance as well as increased strength. The actual strength of the product metal matrix/ceramic fiber composite material is a function of the strength of the metal matrix, the bonding strength between the fiber and the metal, and the strength of the fibers.

Since the primary determinant of the strength level of the metal matrix/ceramic fiber composite is the metal component's physical properties, the strength of the ceramic-reinforced metal composite is ultimately limited by the microstructure of the metal. While currently available metal matrix/ceramic fiber composites achieve definite improvements in a number of important structural properties, relative to either ceramics or metals alone, these metal matrix/ceramic fiber composites nonetheless do not even begin to approach the maximum physical and performance properties which arguably should result from the combination of ceramics and metals based on theoretical considerations.

Another metal and ceramic combination which has been proposed by the art is a metal-reinforced ceramic composite. This type of composite, which is comprised primarily of ceramic (with ceramic as the continuous phase, and metal as the discontinuous or reinforcement phase), differs from conventional ceramic materials in that the metal-reinforced ceramics are much less brittle and less prone to formation defects than the corresponding pure ceramic component.

Various types of such metal-reinforced ceramic composites have been proposed in the art.

One type of such metal-reinforced ceramic composites comprises composites which physically incorporate crystalline metal into the ceramic matrix. These composites, well known in the art, are often formed by mixing the ceramic and metal components, or by depositing one component into a matrix of another, and then, if necessary, heating the both until the metal and ceramic bond. An illustrative deposition method of such type is described by Mohammad Ghouse in "Influence of Heat Treatment on the Bond Strength of Codeposited Ni—SiC Composite Coatings," Surface Technology, 21 (1984), 193–200. In the methodology disclosed in this article, a heat treatment is employed to bond the composite metal to a ceramic substrate, after codeposition of the composite metal and ceramic components.

Other chemical or electrochemical methods for forming the aforementioned type of such metal-reinforced ceramic composite are known in the art, as well as thermal methods of hot pressing.

Due to the substantial temperature sensitivity of amorphous metals, and the overall difficulty associated with the formation of the amorphous phase, metal reinforced ceramics produced through hot pressing or sintering techniques cannot accommodate the desirable amorphous form of metal in the fabrication of the composite.

Only recently has the use of amorphous metal with ceramics in composites applications been proposed by the art. U.S. Pat. 4,770,701 to Henderson et al. discloses a form of and method for producing such composites comprising amorphous metals and ceramics.

The Henderson et al. '701 patent discloses a method of forming an amorphous or microcrystalline metal-ceramic composite, comprising intimate physical mixing of alloying metal and ceramic particles in the presence of heat and reaction catalyst. The resulting composition undergoes a solid state formation reaction, which chemically creates a dual-phase microstructure composed of ceramic particles held together by amorphous and/or microcrystalline metal alloy. The metal is in the amorphous and/or microcrystalline state because it is chemically deposited in solid form in thin layers between the ceramic particles.

An inherent weakness of the material formed by process of the Henderson et al. patent, and the forming process itself, is the dependence of such composite system on a solid state reaction which is difficult to control in such manner as to ensure uniform thickness of the metal. The metal thickness is an extremely important aspect of the binding metal that ultimately determines the strength of the material. A related weakness of the amorphous metal—ceramic particle bonded material of this patent is that it is limited to less than 25% amorphous metal. Any higher concentrations of amorphous metal give rise to thicker layer clusters of metal than is acceptable, in turn causing the crystal grains in the metal to be larger than desired, and thereby losing the significant structural and performance benefits derived from the presence of microcrystallinity and amorphousness of the metal component in the composite.

An inherent weakness of the above-described metal/ceramic composites is their dependence on the bonding of metal to ceramic which is the basis for amorphous metal—ceramic particle bonded amorphous metal-ceramic composites.

Another weakness of such prior art composite material formation techniques and deficiency of the material itself is that the rate at which the material may be formed is dependent on the solid state reaction time.

Related to these weaknesses is the expense and complexity associated with incorporating metal or ceramic constituents into the composite structure.

Accordingly, it is an object of the present invention to provide a new composite having high structural strength comprising amorphous metal and ceramic, that is not dependent on solid state reaction rates.

It is a further object of the present invention to provide a composite material comprising amorphous metal and ceramic wherein the percentage concentration of amorphous metal is not limitingly constrained by solid state reactions, and wherein the amorphous metal content may range from as low as 1 percent to as high as 99 percent.

It is a further object of the present invention to provide a composite material comprising amorphous metal and ceramic which is substantially independent of the bonding of the metal and ceramic components.

It is a further object of the present invention to provide a generalized composite material comprising amorphous metal and ceramic for which alternate ceramic or metal constituent elements are more easily substituted into the material formation process.

It is further object of the present invention to provide a novel less expensive process for making a structural material comprising amorphous metal and ceramic.

It is further object of the present invention to provide a process for making a composite material comprising amorphous metal and ceramic which is substantially faster and less complex than prior art techniques.

Other objects and advantages will be more fully apparent from the ensuing disclosure and appended claims.

SUMMARY OF THE INVENTION

The foregoing objects of the invention are accomplished by providing a novel composite material comprising a multilayered structure of amorphous metal ribbon and ceramic constituent layers.

The amorphous metal preferably is of a high tensile strength character, with a low percentage inhibitor (typically less than 10% by weight inhibitor, based on the total weight of the inhibitor-containing amorphous metal), and preferably is in the form of a ribbon, or woven sheet of ribbon, of the amorphous metal.

The ceramic may comprise any useful material which is providable in or curable to a solid state, and produces a useful structural composite material in combination with the amorphous meta layers. When the ceramic component is a curable material, it suitably has a curing temperature below the recrystallization temperature of the amorphous metal in the composite. Preferably, the ceramic is a low curing temperature (<600° C.), high compressive strength (>2000 psi) material.

In one embodiment of the present invention the composite structure comprises a simple planar sandwich of amorphous metal ribbon, or a woven sheet of individual amorphous ribbon elements, and ceramic material layers.

In a particularly preferred embodiment of the present invention, the composite material is formed as a spirally wound article, comprising spirally wound alternating layers of amorphous metal and ceramic.

The foregoing objects of the invention are further accomplished by providing a method of producing a composite material comprising alternating layers of amorphous metal ribbon, or continuous woven sheets of amorphous metal ribbon, and a layer of uncured pre-ceramic liquid or paste. The resulting composite structure may be suitably housed in a cure processing mold, constituting a shape-conserving ceramic curing container, within which the ceramic layers in the composite are allowed to cure at a temperature lower than the recrystallization temperature of the amorphous metal for sufficient time and at sufficient temperature to form a cured ceramic in the resulting ceramic/amorphous metal composite product article.

Amorphous metals of the type generally useful in the practice of the present invention typically have a recrystallization temperature, i.e., a temperature at which the material begins to form crystallite domains in its structure (as evidenced by the emergence of grain boundaries in the microcrystalline morphology of the material), that is on the order of from about 400° C. to about 600° C., more preferably from about 425° C. to about 550° C., and most preferably from about 450° C. to about 525° C.

As used herein, the term "ceramic" is intended to be broadly construed, to encompass conventional ceramics materials, i.e., inorganic, nonmetallic materials which are processed or consolidated at high temperature on the order of 200° C.–500° C., as well as oxides, nitrides, borides, carbides, silicides, sulfides, intermetallic compounds such as aluminides, beryllides, phosphides, antimonides, and arsenides, as well as polymers, and cermet compositions. An illustrative listing of suitable ceramic materials potentially useful in the broad practice of the present invention is found in "McGraw-Hill Encyclopedia of Science and Technology," 7th Edition, Pages 433 et seq. The ceramic material should be formable or processable in or to a solid state, at a temperature which is less than the recrystallization temperature of the amorphous metal component (so that the amorphous character of the metal is maintained during any processing (e.g., curing) required for final forming of the product composite article). The ceramic material may be of a type which is formable in place, such as ceramics formable by sol gel or related techniques, including silica, alumina, titania, and the like.

In a preferred aspect of the present invention, the ceramic comprises a curable medium which is alternated in relationship to amorphous metal layers and which then is processed to cure the ceramic component, at a temperature less than the recrystallization temperature of the amorphous metal component. Such curing may involve chemical reactions such as cross-linking, condensation reaction, solvent evaporation, or any other formation method by which a solid ceramic component is provided in alternating relationship to the amorphous metal layers in the multilayer laminate structure.

Among classical ceramic materials which may be used in the broad practice of the present invention, various clays, refractories, and cements may be employed.

Among polymeric materials which may find utility in the broad practice of the present invention are epoxy resin components which are heat-curable or ambient temperature curable in character, including the epoxy materials described in "Epoxy Resins, Chemistry and Technology," May and Tenaka, Marcel Dekker, Inc., New York (1973), as well as polysulfones, polyimides, bis-maleimide polymers, etc., vitreous carbon, glasses, and advanced ceramic materials such as silicon nitride, silicon carbide, zirconia, zirconia-toughened alumina, aluminum nitride, lead magnesium niobate, silicon carbide-reinforced alumina, and copper oxide high temperature superconductors.

The formation and processing of the various aforementioned ceramic materials is well known in the art, and a wide variety of ceramic materials may be readily usefully employed within the skill of such art.

Generally, preferred ceramic materials in the broad practice of the present invention have a flexible strength measured in MPa of at least 200, and a fracture toughness ($K_{IC}$), measured in MPa·m$^{1/2}$ of at least 2.

In another aspect, the invention relates to a composite high temperature superconductor (HTSC) structure, comprising:

an HTSC element;

an amorphous metal cladding on the HTSC element; and a non-HTSC ceramic layer on the amorphous metal cladding.

The HTSC element may for example comprise an HTSC fiber having a diameter in the range of from about 20 to about 100 microns, having the amorphous metal clad thereon at a thickness of from about 200 nanometers up to about 2.5 microns or more, and the non-HTSC ceramic layer on the cladding may be a dielectric or insulative ceramic as necessary or desirable in a given end use application. Such HTSC composite structure may be usefully employed as a superconductor structure in diverse applications such as power transmission lines, generators, superconducting magnets, and motors.

Other aspects and features of the invention will be more fully apparent from the ensuing disclosure and appended claims.

DETAILED DESCRIPTION OF THE INVENTION, AND PREFERRED EMBODIMENTS THEREOF

While the present invention is described more fully hereinafter with reference to the accompanying drawings, in connection with which particular embodiments and methods of fabrication are illustrated, it is to be understood that persons skilled in the art may modify the invention herein described from the specific forms and structures illustrated, while still achieving the purpose, function and results of this invention. Accordingly, the descriptions which follow are to be understood as illustrative and exemplary of specific structures, aspects and features within the broad scope of the present invention and not to be construed as limiting of the broad scope of the present invention.

In the ensuing description, like numbers refer to like elements throughout.

Figure 1:
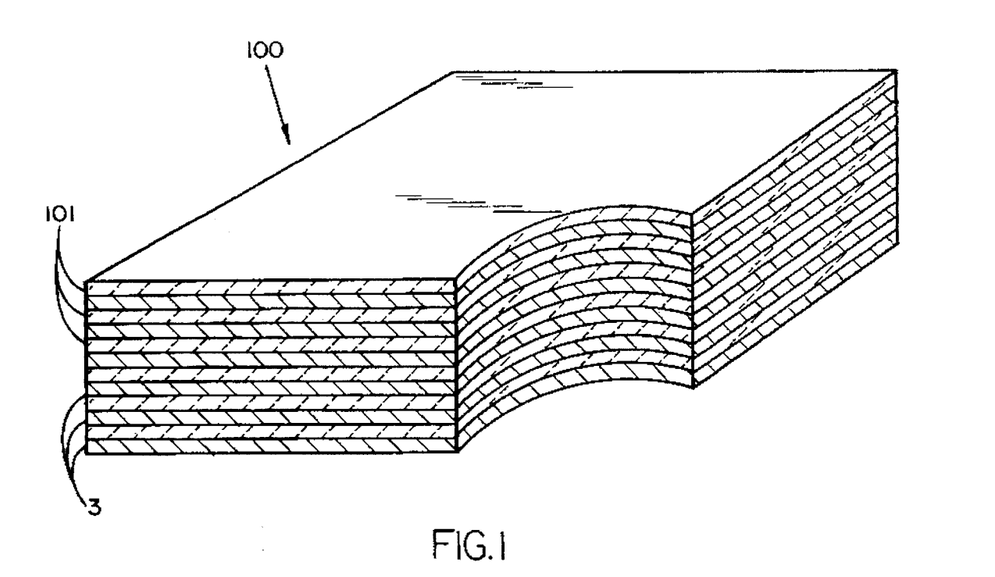
FIG. 1 is a cross-sectional view of one embodiment of the present invention, in the form of a planar sandwich structure comprising a laminate of sequential layers of amorphous metal and ceramic, in alternating relationship to one another.

Referring now to FIG. 1, a ceramic/amorphous metal composite article 100 according to one embodiment of the present invention, comprising alternating layers of amorphous metal and ceramic is illustrated in a cross-sectional view. The composite article comprises multiple layers of amorphous metal 3, such layers being in the form of single ribbons or woven sheets of ribbon of amorphous metal.

Although shown in the generally planar or flat form of a unitary sheet of amorphous metal ribbon in the composite of FIG. 1, it will be recognized that other forms and structures of the amorphous metal may be employed, as for example non-woven sheets of amorphous metal fibers or strands, undulating or curvate sheets of amorphous metal, etc. The amorphous metal component may also be in the form of a multiplicity of woven web members formed by interleaving or twining of discrete ribbon or strip elements, and with the resulting web members being dispersed in the ceramic material of the composite, with the web members being generally parallelly aligned with respect to one another, or otherwise distributed in a preferably uniform manner in the ceramic medium. Nonetheless, it is generally highly preferred in practice to utilize the amorphous metal in the form of unitary laminae which are alternatingly deployed with respect to ceramic layers (so that the composite laminate has an A-B-A-B-A-B- . . . structure, wherein A represents an amorphous metal layer, and B a ceramic layer) in the composite.

The respective alternating layers or laminae of amorphous metal thus are provided in a sandwich laminated structure in the FIG. 1 embodiment, with layers 101 of ceramic material alternating with the individual layers of the amorphous metal.

The layers of ceramic may suitably have a thickness in the range of from about 1 to about 200 mils, and the amorphous metal layers may suitably have a thickness in the range of from about 0.5 to about 100 mils.

Preferably the thickness of ceramic material layers of the composite in the practice of the invention is from about 2 to about 100 mils, and more preferably from about 4 to about 80 mils. The amorphous metal layers of the composite preferably have a thickness of from about 1.0 to about 40 mils, more preferably from about 1.5 to about 20 mils, and most preferably from about 2 to about 10 mils.

Concerning thicknesses of the ceramic outside of such broad range of from about 1 to about 200 mils, ceramic thicknesses of greater than 200 mils tend to result in loss of the synergy achieved by the combination of metal and ceramic layers, so that the composite becomes sufficiently ceramic in character (when the metal thickness is in the aforementioned range of 0.5 to about 100 mils) so as to lose the benefit of the amorphous metal characteristics, so that the strength and impact resistance characteristics of the composites are detrimentally reduced below acceptable levels characteristic of composites in which the thickness of the ceramic layers is less than about 200 mils.

At ceramic thicknesses below about 1 mil, the ceramic layers tend to become so thin as to be susceptible to the formation of discontinuities and void spaces therein, which impair the overall structural integrity and performance characteristics of the product composite.

Corresponding considerations apply to the respective preferred ranges identified above, in respect of the thickness of the ceramic layers in the composite.

Correspondingly, metal thicknesses outside the range of from about 0.5 to about 100 mils are unsatisfactory in terms of the structural and performance characteristics of the composite comprising the metal and ceramic layer components.

At metal layer thicknesses greater than about 100 mils, the thickness of metal is such that the metal layers become relatively rigid and inflexible, relative to metal thicknesses in the aforementioned range of from about 0.5 to about 100 mils, so that various stresses (compressive, tensile, portional, vibrational, etc.) to which the composite is exposed in use, are not effectively accommodated by the composite structure, and such stresses at such greater metal thicknesses can result in delamination of the contiguous metal and ceramic layers at their respective interfaces.

At metal layer thicknesses below about 0.5 mil, the metal layer of the composite becomes susceptible to discontinuities and void spaces which, as in the case of the ceramic layer component, tends to unsatisfactorily weaken the overall composite material.

Corresponding considerations apply to the end points of the aforementioned preferred metal thickness ranges.

The metal used in this layered amorphous metal-ceramic composite is an amorphous metal containing a sufficiently low amount of inhibitor element(s) so that the amorphous character of the metal is not adversely affected or lost in the processing or use of the composite containing such metal. In instances where the ceramic medium of the composite is at least partially formed or cured in the production of the composite, such as by lay-up or formation of the ceramic component in a "prepreg" or precursor structure in which the ceramic is in a "green" or uncured state, the amorphous metal should accomodate the thermal conditions of the processing of the ceramic, as well as any other processing conditions involved with such processing (e.g., radiation exposure of the ceramic in the composite), without loss of such amorphous character of the metal.

In instances where the amorphous metal is deposited on the ceramic elements of the composite, as for example by chemical vapor deposition or other deposition or plating technique, the metal processing temperatures should be such as to allow amorphous solidification of the metal to be achieved without detriment to the high tensile strength of the non-crystalline metal, or impairment of the non-crystalline morphology of the metal. In those instances where the ceramic is deposited on the amorphous metal at a high temperature (>500° C.), as for example by chemical vapor deposition or other deposition technique, temperatures of the metal layer should be maintained below the recrystallization temperature by supplemental cooling. One such supplemental cooling technique (developed by Dr. Nicholas Grant, Massachusetts Institute of Technology, Department of Materials Science) maintains a cooled hollow cylindrical substrate through which a coolant, such as liquid nitrogen, is flowed, and onto which a heated material may be deposited. The cooling capacity of such a deposition system, if used in the practice of the present invention to deposit the ceramic onto the cooled amorphous metal, must of course be sufficient to maintain the amorphous metal in the desired non-crystalline state.

Generally, inhibitor component(s) are usefully employed in the amorphous metal, to inhibit crystallite or grain formation in the metal. Such inhibitors may be employed at any suitable concentration necessary or desirable to achieve the crystallite/nucleation-inhibitory function. Typically, the inhibitor component(s) concentration in the amorphous metal in the broad practice of the invention, should be less than about 10% by weight, e.g., in the range of 0.2 to 10% by weight, more preferably 0.5 to 9% by weight, and most preferably 1 to 8% by weight, based on the weight of the inhibitor-containing metal (i.e., the total weight of the amorphous metal and the inhibitor component(s)).

Suitable inhibitor components for amorphous metals variously useful in the broad practice of the present invention include, but are not limited to, silicon, boron, and phosphorous. Any inhibitor components useful to supress nucleation or grain formation in the amorphous metal may be advantageously employed.

In like manner, the amorphous metal itself may be of any suitable type which is compatible with the ceramic component of the composite and useful to achieve the objective of the composite in the use or application thereof. Illustrative high-strength amorphous metals of a commercially available character include the amorphous metal compositions manufactured by Metglas Products-Allied Signal/NamCo.—6 Eastmans Rd., Parsippany, N.J., such as Al—Fe—V—Si, Al—Li—V—Si, Mg—Zn—Al—Si, Mg—Zn—Al—Nd, Au—Ni—Fe—Cr, and Mg—Zn—Al—Y metal alloy compositions. The amorphous metal compositions of the invention preferably have tensile strengths levels approaching and exceeding 100,000 psi.

While, as mentioned, various forms of amorphous metals are potentially useful in the broad practice of the present invention, ribbons of amorphous metal constitute a preferred amorphous metal form for the composite of the present invention. Such ribbons of the amorphous metal may for example be produced by rapid thermal quenching of molten metal by spin cooling of the metal in a known and conventional manner. In this ribbon form, the amorphous metal may be flexible enough to be readily shaped into any of a wide variety of regular or irregular shapes, e.g., rolled at a small radii of curvature.

It will be appreciated that in a thin ribbon form, the amorphous metal member possesses a high character of flexibility, and this flexibility permits the formation of diverse embodiments of widely varied shape and conformation, such as the spirally wound embodiment shown in FIG. 2 and described hereinafter.

The curable ceramics preferably employed in the practice of the invention have high compressive strengths and curing temperatures which are lower than the recrystallization temperatures of the amorphous metal components in the composites. Included in such ceramics are those of a type which cure by water evaporation (herein evaporative curing ceramics), or by chemical reaction (herein referred to as ionic ceramics). The ceramic material desirably has the capability to be spread, sprayed, coated or otherwise readily deposited onto the amorphous metal component. Ceramics which are particularly useful in the broad practice of the invention include a wide variety of high compressive strength cements and cermet materials which are of an ionic or evaporatively curing type.

Figure 2:
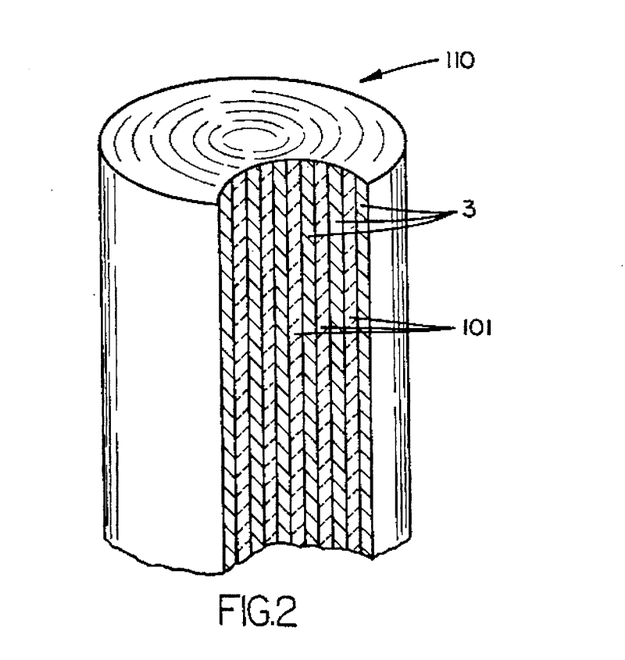
FIG. 2 is a cross-sectional view of another embodiment of the present invention, in the form of a spirally wound laminate structure of amorphous metal and ceramic layers, in alternating relationship to one another.

Referring now to FIG. 2, a spirally wound amorphous metal and ceramic composite tubular member 110 according to another embodiment of the present invention is illustrated in a cross-sectional view. This alternatingly layered spirally wound tubular structure comprises an amorphous metal sheet 3 spirally wound about the longitudinal axis of the tubular member, with a ceramic layer 101 intermediately disposed between successive windings (layer wraps) of the continuous amorphous metal sheet.

Figure 3:
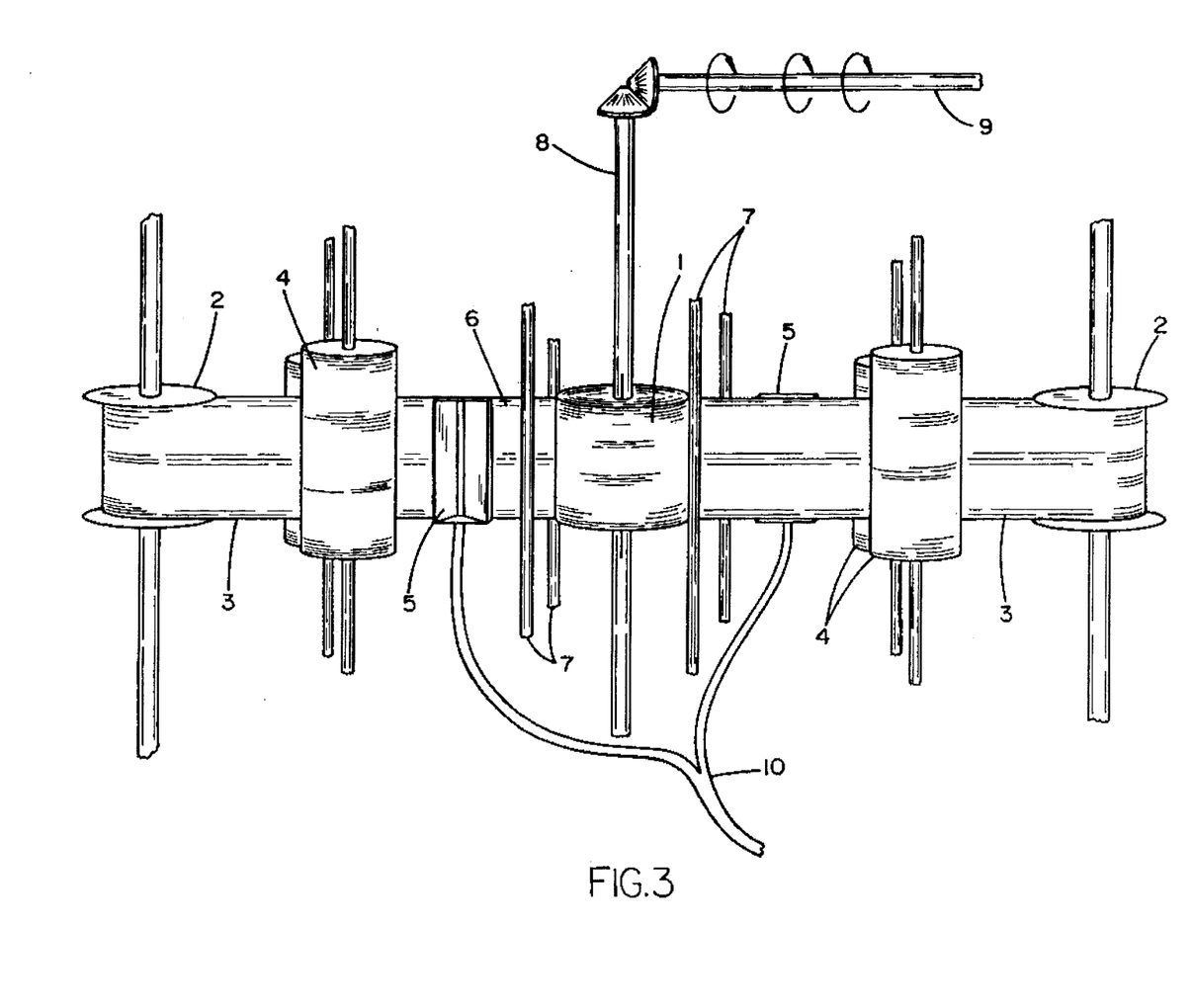
FIG. 3 is a perspective view of a spirally wound structure of the type shown in FIG. 2, illustrating a method of fabrication thereof.
Figure 4:
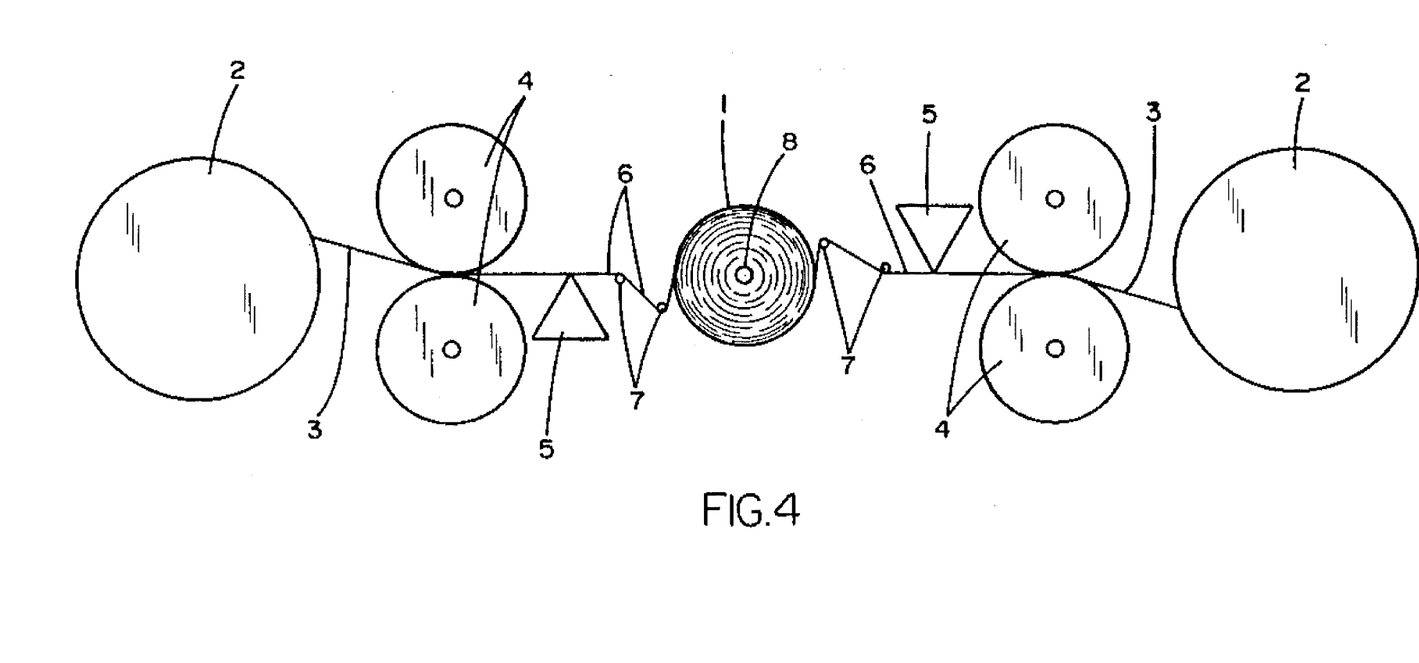
FIG. 4 is a top view illustrating of a spirally wound structure according to one embodiment of the present invention, illustrating the method of formation thereof.

Referring now to FIGS. 3 and 4, a method of manufacturing a spirally wound tubular amorphous metal—ceramic composite structural member according to one embodiment of the present invention is illustrated with reference to a perspective and a top view, respectively, of an apparatus for carrying out such method.

According to such method of fabrication, a continuous amorphous metal ribbon, or sheet of woven amorphous metal ribbon, coated with a thin layer of uncured ceramic, is tightly wound into a spirally wound, essentially cylindrical conformation.

In the illustrated composite forming system, a continuous amorphous metal ribbon (or woven sheet) 3 is fed from opposite sides of the process system, from spools 2 on which the ribbon or woven sheet 3 has previously been stored. As the metal web is windingly drawn onto the tubular or cylindrical structure 1, about the winding shaft 8, by turning thereof, it first passes from the spools 2 between a pair of adjacent and touching cylinders 4 which rotate in opposite directions along a parallel axis at a same magnitude of tangential velocity at their surface interface, thereby avoiding slippage. As the ribbon or sheet 3 passes between these rotating cylinders 4, the speed of the ribbon 3 being wound onto the composite structure is matched to the speed of the rotating cylinders 4. The purpose of such controlled speed is to impart a constant tension in the coated amorphous metal 6 as it winds about the shaft 8.

It will be appreciated that alternate means may be used to impart a regular and controlled tension to the amorphous metal sheet in the composite fabrication system, without the necessity of the rotating drums shown in FIG. 3.

In an alternative embodiment, the cylinders 4 may rotate at a speed determined by the rotation of the shaft 8. In this alternate embodiment, the cylindrical drums 4 rotate with a constant counter-rotational damping force, to impart a desired level of tension to the ribbon 3.

The tensioned amorphous ribbon 3 passes from the rotational drums 4 to a ceramic deposition device 5. This device deposits a thin layer of uncured ceramic on one side of the ribbon 3. In a preferred embodiment, the ceramic may either be sprayed or extrusion spread onto what is to be the inside surface of the amorphous metal ribbon in the ceramic/amorphous metal wound composite 1. The uncured ceramic is pressurized and then pumped to the deposition device 5 through connecting tubes 10.

The ceramic-coated amorphous metal 6 passes from the ceramic deposition device 5 to a pair of guide vanes 7. The first of the two guide vanes 7 touches the side of the metal which has been coated with the ceramic, and serves to ensure that the ceramic is evenly spread. The second of the two guide vanes 7 touches the uncoated side of the coated ribbon 6, and directs the ceramic coated metal 6 onto the winding compact structure 1.

The winding shaft 8, in the preferred embodiment of the method apparatus, is driven by a rotating shaft 9, although any suitable rotation-imparting means may be advantageously employed for such purpose.

Figure 5:
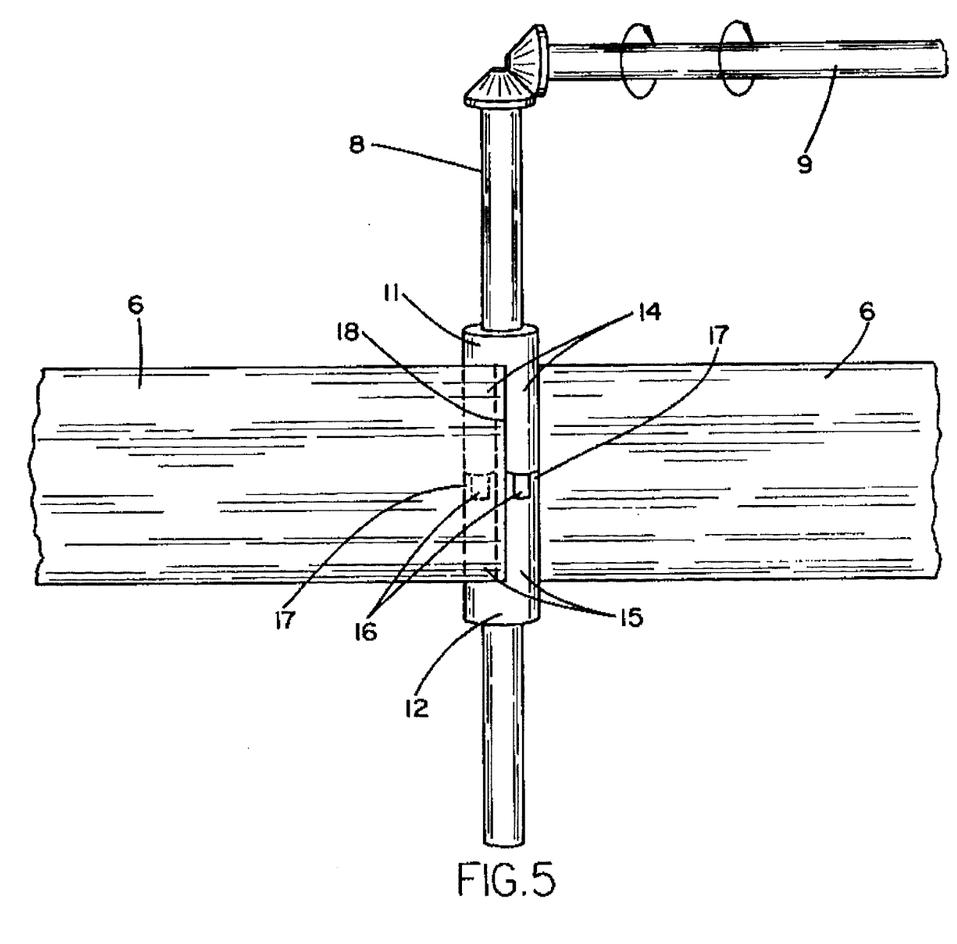
FIG. 5 is a perspective view of a winding shaft of a forming apparatus used in one method of fabricating a spirally wound ceramic/amorphous metal composite according to one embodiment of the present invention.

FIG. 5 is a perspective view of a winding shaft of a forming apparatus used in one method of fabricating a spirally wound ceramic/amorphous metal composite according to an illustrative embodiment of the present invention. The winding shaft has a receiving port therein for receiving the amorphous ribbon. As illustrated, the continuous ceramic coated amorphous ribbon 6 passes through the shaft 8. The shaft 8, in a preferred form, is constructed with a separable forked upper half 11 and lower half 12 which connect as the tips 16 of the forked prongs 14 of the upper half 11 are inserted into the tips 17 of the fork prongs 15 of the lower half 12, thereby forming the receiving port.

Once the amorphous metal ribbon or sheet 6 passes through the port 18 formed by the connected forked halves 11 and 12 of the shaft 8, the rotation of the shaft 8 causes the amorphous metal ribbon or sheet 6 to wind into a layered tubular shape 1.

At the end of the winding process (once the composite is built up to the desired outer diameter or otherwise achieves a final product size criterion), the upper and lower halves 11 and 12 may be separated to release the composite. The hollow center of the tube then may be left untilled, filled by ceramic, or filled with any other appropriate material.

The uncured composite structure 1 may then be positioned in an appropriate shaped curing container which allows the ceramic material to set and cure without unwinding.

The present invention relates in another aspect to a composite high temperature superconductor (HTSC) structure, comprising:

an HTSC element;

an amorphous metal cladding on the HTSC element; and a non-HTSC ceramic layer on the amorphous metal cladding.

As used herein, the term "superconductor" and "high temperature superconductor" refer to materials having superconducting properties, and preferably materials displaying superconductivity, i.e., near-zero electrical resistance, at temperatures above near absolute zero temperatures, preferably above 20 degrees Kelvin, and most preferably above about 50 degrees Kelvin.

The HTSC element in superconducting composites of the invention may be formed of any suitable high temperature superconductor material, such as metal oxide superconductors comprising admixtures of metals from Groups IB, IIA, and IIIB of the Periodic Table. Illustrative materials of such type include the metal oxide superconductors of the yttrium-barium-copper ($YBa_2Cu_3O_y$) type, the so-called "123" HTSC materials, wherein y may be from about 6 to about 7.3, as well as materials where Y may be substituted by Nd, Sm, Eu, Gd, Dy, Ho, Yb, Lu, $Y_{0.5}$—$Sc_{0.5}$, $Y_{0.5}$—$La_{0.5}$, and $Y_{0.5}$—$Lu_{0.5}$, and where Ba may be substituted by Sr—Ca, Ba—Sr, and Ba—Ca. Another illustrative class of superconductor materials includes those of the formula $(AO)_mM_2Ca_{n-1}Cu_nO_{2n+2}$, wherein the A cation may be thallium, lead, bismuth, or a mixture thereof, m=1 or 2 (but is 2 only when A is bismuth), n is a number from 1 to 5, the M cation is barium or strontium, and the substitution of calcium by strontium is frequently observed. Other superconductor materials which may be advantageously used in the broad practice of the present invention include those illustratively described in U.S. Pat. Nos. 5,132,278; 4,990,490; and 5,225,561 (see especially Table I therein), the disclosures of which are hereby incorporated herein by reference.

The HTSC element may for example comprise an HTSC fiber having a diameter in the range of from about 20 to about 100 microns, having the amorphous metal clad thereon at a thickness of from about 200 nanometers up to about 2.5 microns or more, and the non-HTSC ceramic layer on the cladding may be a dielectric or insulative ceramic as necessary or desirable in a given end use application. The amorphous metal component may comprise, in addition to the metal alloy compositions hereinabove illustratively described, copper, gold, silver, chromium, iridium, aluminum, platinum, palladium, indium, tin, bismuth, lead, silver-tin, silver-indium, etc. The non-HTSC ceramic may comprise any suitable ceramic material from among those illustratively described hereinabove.

Figure 6:
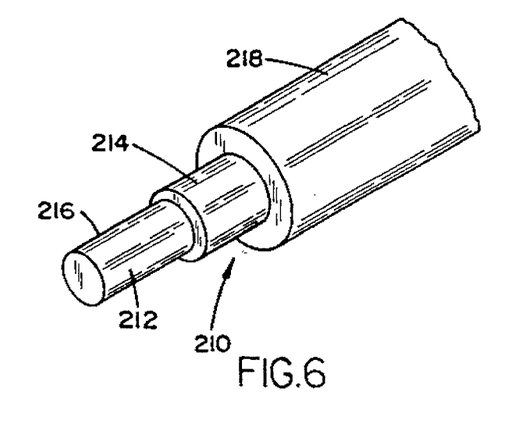
FIG. 6 is a perspective view of a superconducting composite cable article according to one embodiment of the invention.

FIG. 6 is a perspective view of a superconducting composite cable article 200 according to one embodiment of the invention, comprising an inner HTSC fiber 212. The superconducting fiber 212 has coated thereon an amorphous metal cladding 214, which in turn has a non-HTSC ceramic cladding 218 thereon. The outer ceramic cladding 218 may instead of the cylindrical cladding conformation shown comprise a bulk matrix cladding in which the amorphous metal-clad HTSC fiber is embedded. Further, the HTSC element instead of being in cylindrical fiber form may be of a flattened or generally planar layer geometry. It will be recognized that the superconductor composite article of the invention may be widely varied in shape, form and construction.

Figure 7:
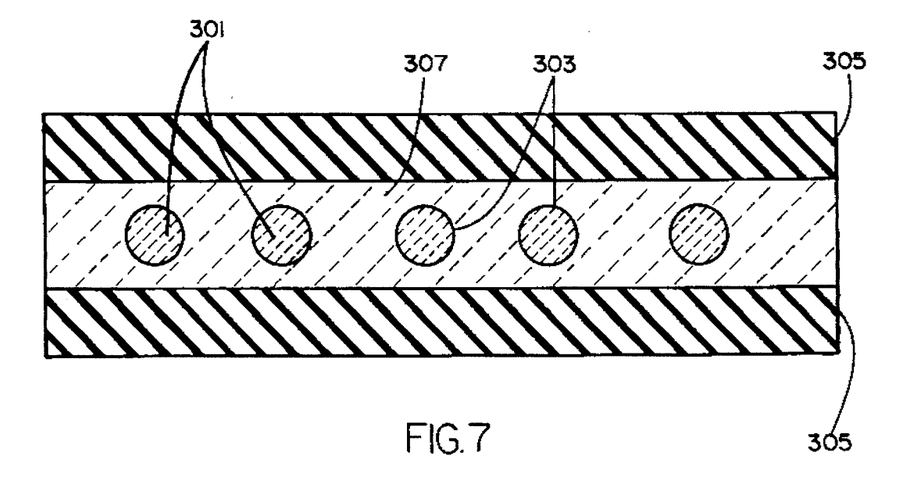
FIG. 7 is an edge elevational view of a superconducting electrical conductor composite article according to another embodiment of the invention.

FIG. 7 is an edge elevational view of a superconducting electrical conductor composite article 300 which includes superconducting ceramic fibers 301 each surrounded by an amorphous metal layer 303, and all embedded in a (non-HTSC) ceramic matrix 307, and outer cladding sheets 305 of a polymer such as polysulfone or polyetherimide.

In the superconducting composite articles of the present invention, the amorphous metal cladding on the HTSC element provides a normal state current path in service, and protects the superconductor from environmental degradation and damage. The amorphous metal cladding may also provide a means for enhancing the performance of the HTSC element in respect of "skin effects" incident to the operation of the superconductor.

Such HTSC composite structure may be usefully employed as a superconductor structure in diverse applications such as power transmission lines, generators, superconducting magnets, high speed operating switches, bolometers, high frequency communications components, and motors.

In the drawings and specification, there have been disclosed various illustrative embodiments of the invention. Although various illustrative features, aspects, and embodiments of the invention have been described herein, it will be appreciated that other variations, modifications, and other embodiments are contemplated, and accordingly the invention is to be broadly construed to encompass such other variations, modifications, and other embodiments, within the spirit and scope thereof.

What is claimed is:

1. A composite material comprising a multi-layered structure having a plurality of discrete layers including at least two separated layers of amorphous metal and at least one continuous layer of a ceramic material between a pair of said separated amorphous metal layers.

2. A composite material according to claim 1, wherein the amorphous metal contains less than 10% by weight of a crystallization inhibitor, based on the total weight of the amorphous metal and crystallization inhibitor.

3. A composite material according to claim 2, wherein the crystallization inhibitor is selected from the group consisting of silicon, boron, and phosphorous.

4. A composite material according to claim 1, wherein the ceramic layers have a thickness in the range of from about 1 to about 200 mils.

5. A composite material according to claim 1, wherein the amorphous metal layers have a thickness in the range of from about 0.5 to about 100 mils.

6. A composite material according to claim 1, wherein the ceramic layers have a thickness in the range of from about 2 to about 100 mils.

7. A composite material according to claim 1, wherein the amorphous metal layers have a thickness in the range of from about 1.0 to about 40 mils.

8. A composite material according to claim 1, wherein the ceramic layers have a thickness in the range of from about 4 to about 80 mils.

9. A composite material according to claim 1, wherein the amorphous metal layers have a thickness in the range of from about 2 to about 10 mils.

10. A composite material according to claim 1, wherein the ceramic is at least partially curable in character.

11. A composite material according to claim 1, wherein the amorphous metal has a recrystallization temperature which is above the curing temperature of the ceramic.

12. A composite material according to claim 1, wherein the ceramic has a curing temperature below 600° C., and a compressive strength greater than 2000 psi.

13. A composite material according to claim 1, wherein the ceramic is cured.

14. A composite material according to claim 1, wherein the amorphous metal layers comprise amorphous metal ribbon.

15. A composite material according to claim 1, wherein the amorphous metal layers comprise a woven sheet of amorphous ribbon elements.

16. A composite material according to claim 1, in the form of a spirally wound article comprising spirally wound alternating layers of amorphous metal and ceramic.

17. A composite material according to claim 1, wherein the amorphous metal comprises a metal selected from the group consisting of Al—Fe—V—Si, Al—Li—V—Si, Mg—Zn—Al—Si, Mg—Zn—Al—Nd, Au—Ni—Fe—Cr, and Mg—Zn—Al—Y metal alloy compositions.

18. A composite material according to claim 17, wherein the tensile strength of the amorphous metal is at least 100,000 psi.

19. A composite material according to claim 1, wherein the amorphous metal has a recrystallization temperature in the range of from about 400° C. to about 600° C.

20. A composite material according to claim 1, wherein the amorphous metal has a recrystallization temperature in the range of from about 425° C. to about 550° C.

21. A composite material according to claim 1, wherein the amorphous metal has a recrystallization temperature in the range of from about 450° C. to about 525° C.

22. A composite material according to claim 1, wherein the ceramic comprises a material selected from the group consisting of:

oxides;

nitrides;

borides;

carbides;

silicides;

sulfides;

aluminides;

beryllides;

phosphides;

antimonides;

arsenides;

polymers; and cermets.

23. A composite material according to claim 1, wherein the ceramic is formed by sol gel processing.

24. A composite material according to claim 23, wherein the ceramic is selected from the group consisting of silica, alumina, and titania.

25. A composite material according to claim 1, wherein the ceramic comprises a polymeric medium.

26. A composite material according to claim 25, wherein the ceramic comprises a material selected from the group consisting of:

epoxies;

polysulfones;

polyimides;

bis-maleimide polymers;

vitreous carbon;

glasses;

silicon nitride;

silicon carbide;

zirconia;

zirconia-toughened alumina;

aluminum nitride;

lead magnesium niobate;

silicon carbide-reinforced alumina; and copper oxide high temperature superconductors.

27. A composite material according to claim 1, wherein the ceramic has a flexural strength measured in MPa of at least 200, and a fracture toughness ($K_{IC}$), measured in MPa·m$^{1/2}$ of at least 2.

28. A composite material comprising a multi-layered structure including plurality of discrete amorphous metal layers and at least one continuous ceramic layer between a pair of said discrete amorphous metal layers, wherein the amorphous metal contains less than 10% by weight of a crystallization inhibitor, based on the total weight of the amorphous metal and crystallization inhibitor, wherein the ceramic layers have a thickness in the range of from about 1 to 200 mils, and wherein the amorphous metal layers have a thickness in the range of from about 0.5 to about 100 mils.

29. A composite material comprising a multi-layered structure including having a plurality of discrete layers of amorphous metal and disposed therebetween at least one continuous layer of a ceramic material, as laminae of the multi-layered structure, wherein each amorphous metal layer is in laminated contacting relationship to said layer of ceramic material.

* * * * *